(12) United States Patent
Wang et al.

(10) Patent No.: US 9,235,590 B1
(45) Date of Patent: Jan. 12, 2016

(54) SELECTIVE DATA COMPRESSION IN A DATABASE SYSTEM

(75) Inventors: Guilian Wang, San Diego, CA (US); Olli Pekka Kostamaa, Santa Monica, CA (US); Gary Allen Roberts, Carlsbad, CA (US); Steven Cohen, Redondo Beach, CA (US); John R. Catozzi, San Diego, CA (US)

(73) Assignee: Teradata US, Inc., Dayton, OH (US)

( * ) Notice: Subject to any disclaimer, the term of this patent is extended or adjusted under 35 U.S.C. 154(b) by 0 days.

(21) Appl. No.: 13/620,384

(22) Filed: Sep. 14, 2012

Related U.S. Application Data

(60) Provisional application No. 61/582,235, filed on Dec. 30, 2011.

(51) Int. Cl.
*G06F 17/30* (2006.01)
*G06F 11/34* (2006.01)
*H03M 7/30* (2006.01)

(52) U.S. Cl.
CPC ...... *G06F 17/30153* (2013.01); *G06F 11/3442* (2013.01); *H03M 7/6088* (2013.01); *H03M 7/6094* (2013.01)

(58) Field of Classification Search
CPC ......... G06F 17/30339; G06F 11/3442; H03M 7/607; H03M 7/6088; H03M 7/6094
See application file for complete search history.

(56) References Cited

U.S. PATENT DOCUMENTS

| | | | |
|---|---|---|---|
| 8,478,731 B1 * | 7/2013 | Throop et al. | 707/693 |
| 2008/0162523 A1 * | 7/2008 | Kraus et al. | 707/101 |
| 2010/0153375 A1 * | 6/2010 | Bilas et al. | 707/723 |

OTHER PUBLICATIONS

Mishra, Data Compression Strategy, Capacity Planning and Best Practices, May 2009.*
Long, New Options for Compression, 2010.*
Mike Stonebraker et al., "C-Store: A column-oriented DBMS", Proceedings of the 31st VLDB Conference, Trondheim, Norway, 2005 (12 pages).
Daniel J. Abadi et al., "Column-Stores vs. Row-Stores:How Different Are they Really?", In Proceedings of SIGMOD, 2008 (14 pages).
Oracle, "A Technical Overview of the Oracle Exadata Database Machine and Exadata Storage Server", An Oracle White Paper, Apr. 2011 (31 pages).
Netezza, "The Netezza FAST Engines Framework", White Paper, 2007 (12 pages).

(Continued)

*Primary Examiner* — William Spieler
(74) *Attorney, Agent, or Firm* — Randy L. Campbell, Jr.

(57) ABSTRACT

A database system may implement compression management of tables in the database system. The compression management may include determination of a pattern of usage of various database tables in the database system. Based on this pattern of usage, the database tables may be selected as candidates for compression or decompression at the appropriate time. In one example, the pattern of usage may be based on the contents of a query log of the database system. The compression management may also include evaluation of various compression strategies to apply to a candidate database table. Each compression strategy may be evaluated to determine if application to a database table or a portion of the database table would be beneficial based on various conditions. The compression management may also include consideration of each available compression strategy to be applied solely or in combination with one another.

26 Claims, 6 Drawing Sheets

(56) References Cited

OTHER PUBLICATIONS

B.A. Marron et al., "Automatic Data Compression", Communications of the ACM, vol. 10, Issue 11, pp. 711-715, 1967.

IBM, Product Overviews for DB2 9.5: Data Compression Dictionary is Created Automatcally, available at hhttp://www-01.ibm.com/support/knowledgecenter/#!/SSEPGG_9.5.0/com.ibm.db2.luw.wn.doc/doc/i0052339.html on Aug. 18, 2015 (1 page).

\* cited by examiner

SELECTIVE DATA COMPRESSION IN A DATABASE SYSTEM

CLAIM OF PRIORITY

This application claims the benefit of priority under 35 U.S.C. §119(e) to U.S. Provisional Patent Application Ser. No. 61/582,235 filed on Dec. 30, 2011, which is incorporated by reference herein in its entirety.

BACKGROUND

1. Technical Field

The present disclosure relates generally to data compression, and more particularly to, compression of data stored in a database.

2. Related Art

A database is a collection of stored data that is logically related and that is accessible by one or more users or applications. A popular type of database is the relational database management system (RDBMS), which includes relational tables, also referred to as relations, made up of rows and columns (also referred to as tuples and attributes). Each row represents an occurrence of an entity defined by a table, with an entity being a person, place, thing, or other object about which the table contains information.

As opportunities to obtain more data in a database increase, so does the requirement for storage capacity. One way to reduce the amount of storage space used to store databases is through data compression. While compressing as much data as possible may be desirable from a storage-efficiency perspective, other factors may require consideration. In operating a database, various queries or other data-driven processes require data to be retrieved for use. Compressed data requires decompressing in order to be used. Thus, when compressing data, considerations regarding the amount of time required to decompress data must be taken into account when attempting to respond to database tasks as quickly and efficiently as possible.

One strategy in identifying data for compression and decompression may include determining the nature and frequency of use of data of a database table. Patterns of usage may allow a more efficient selection of data for compression. Various manners of compression may also be considered and applied singularly or in combination.

SUMMARY

In one aspect of the present disclosure, a database system may implement compression management of tables in the database system. The compression management may include determination of a pattern of usage of various database tables in the database system. Based on this pattern of usage, the database tables may be selected as candidates for compression. In one example, the pattern of usage may be based on the contents of a query log of the database system.

In another aspect of the disclosure, compression management may also include evaluation of various compression strategies to apply to a candidate database table. Each compression strategy may be evaluated to determine if application to a database table or a portion of the database table would be beneficial based on various conditions. Conditions associated with the access frequency of the database table, an amount of processing resources involved in compression and decompression, an amount of storage saved through compression, and the timing of compression and decompression.

In another aspect of the disclosure, compression management may also include consideration of each available compression strategy to be applied solely or in combination with one another. Each compression strategy may include one or more compression algorithms. Each available algorithm may be evaluated each time a compression strategy is considered.

The various aspects of the disclosure may be implemented as a system, method, or instructions stored on computer-readable media or may be implemented as a combination thereof.

BRIEF DESCRIPTION OF THE DRAWINGS

The disclosure may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE DRAWINGS

Figure 1:
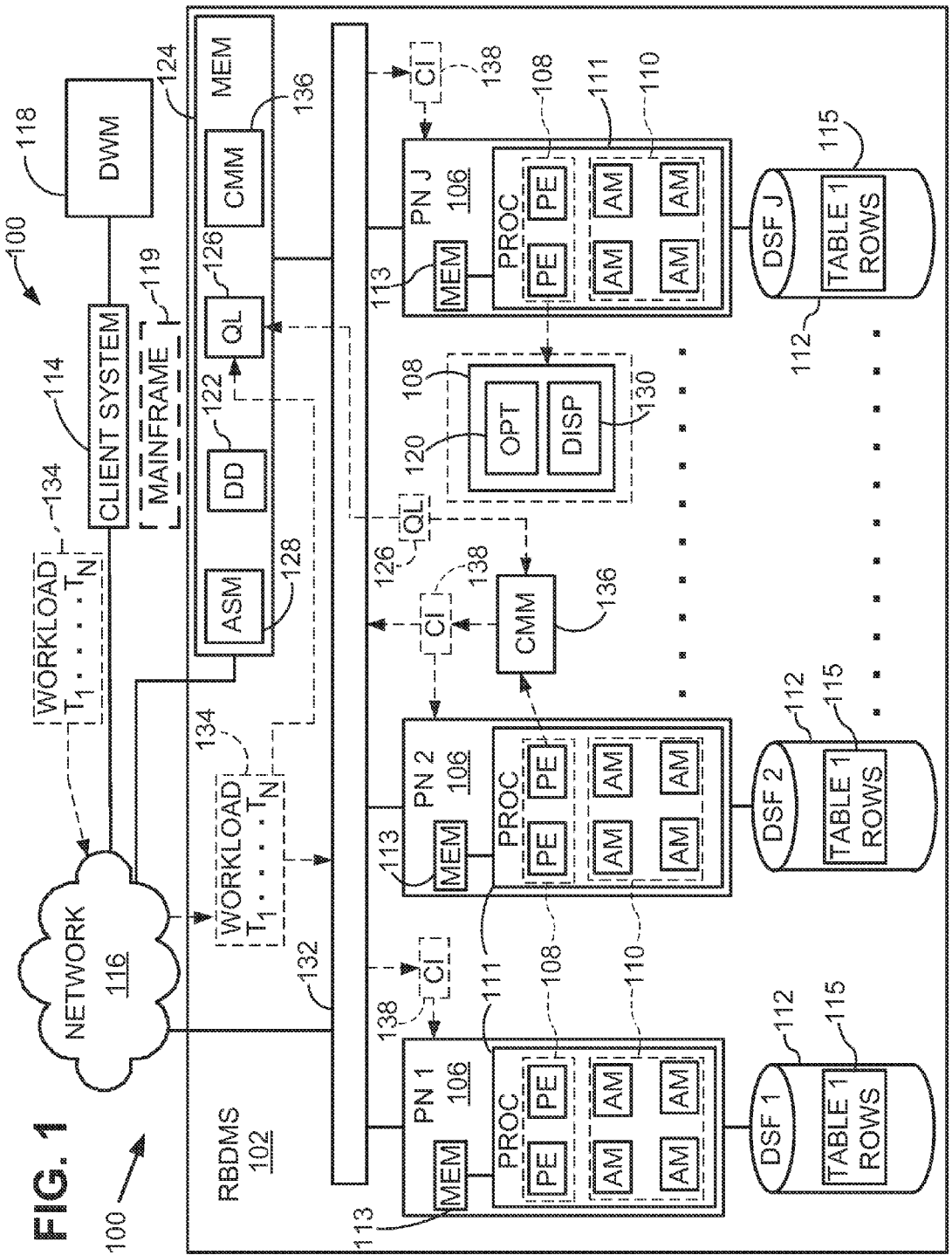
FIG. 1 is a block diagram of an example database system.

FIG. 1 is a diagrammatic representation of example architecture for a database system 100, such as a Teradata Active Data Warehousing System®. In one example, the database system 100 includes a relational database management system (RDBMS) 102 that implements a parallel-processing environment to carry out database management. The RDBMS 102 may be a combination of software (e.g., computer program routines, subroutines, applications, etc.) and hardware (e.g., processors, memories, etc.). In the example of FIG. 1, the RBDMS 102 may be a massive parallel processing (MPP) system having an array of processing units and distributed memory. In alternative examples, the RBDMS 102 may implement a single processing unit, such as in a symmetric multiprocessing (SMP) system configuration.

The RBDMS 102 may include one or more processing units used to manage the storage, retrieval, and manipulation of data in the data-storage facilities. The array of processing units may include an array of processing nodes (PN) 106 that manage the storage, retrieval, and manipulation of data included in a database. In FIG. 1, the processing nodes 106 are individually indexed as PN 1 through PN J, where J may represent the total number of processing nodes 106 in the database system 100 or, alternatively, may represent the total number of active processing nodes 106 in the database system.

In one example, each processing node 106 may include one or more physical processors 111 and memory 113. The memory 113 may include one or more memories and may be computer-readable storage media or memories, such as a cache, buffer, RAM, removable media, hard drive, flash drive or other computer-readable storage media. Computer-readable storage media may include various types of volatile and nonvolatile storage media. Various processing techniques may be implemented by the processors 111 such as multiprocessing, multitasking, parallel processing and the like, for example.

The processing nodes 106 may include one or more other processing unit arrays such as parsing engine (PE) modules 108 and access modules (AM) 110. As described herein, "modules" are defined to include software, hardware or some combination thereof executable by one or more physical and/or virtual processors. Software modules may include instructions stored in the one or more memories that are executable by one or more processors. Hardware modules may include various devices, components, circuits, gates, circuit boards, and the like that are executable, directed, and/or controlled for performance by one or more processors. The access modules 110 may be access modules processors (AMPs), such as those implemented in the Teradata Active Data Warehousing System®.

The parsing engine modules 108 and the access modules 110 may each be virtual processors (vprocs) and/or physical processors. In the case of virtual processors, the parsing engine modules 108 and access modules 110 may be executed by one or more physical processors, such as those that may be included in the processing nodes 106. For example, in FIG. 1, each parsing engine module 108 and access module 110 is associated with a respective processing node 106 and may each be executed as one or more virtual processors by physical processors 111 included in the respective processing node 106. In FIG. 1, each processing node 106 is shown as including multiple parsing engine modules 108 and access modules 110, such that there are more parsing engine modules 108 and access modules 110 than processing nodes 106. In one example, during operation, the one or more physical processors 111 included in the processing nodes 106 may execute the parsing engine modules 108 and access modules 110 by switching between the executions of the various modules at a rapid rate allowing the vprocs to substantially operate in "parallel."

The RBDMS 102 stores database data in one or more tables in data-storage facilities (DSFs) 112. In one example the DSFs 112 may be any type of computer-readable storage media or memories and include an array of storage devices, such as hard drive, flash drive, or any other suitable disk or data storage device capable of the desired storage. In one example, rows 115 of a table, "Table 1," are distributed across the DSFs and in accordance with their primary index. The primary index defines the columns of the rows that are used for calculating a hash value. The function that produces the hash value from the values in the columns specified by the primary index is called the hash function. Some portion, possibly the entirety, of the hash value is designated a "hash bucket." The hash buckets are assigned to data-storage facilities 112 and associated processing modules 110 by a hash bucket map. The characteristics of the columns chosen for the primary index determine how evenly the rows are distributed.

Rows of each stored table may be stored across multiple DSFs 112. In FIG. 1, the DSFs 112 are individually indexed as 1 through J to illustrate correspondence with each processing node 106. Each parsing engine module 108 may organize the storage of data and the distribution of table rows. The parsing engine modules 108 may also coordinate the retrieval of data from the data-storage facilities 112 in response to queries received, such as those received from a client computer system 114 connected to the RBDMS 102 through connection with a network 116. The network 116 may be wired, wireless, or some combination thereof. The network 116 may be a virtual private network, web-based, directly-connected, or some other suitable network configuration. In one example, the client computer system 114 may run a dynamic workload manager (DWM) client 118. Alternatively, the database system 100 may include a mainframe 119 used to interact with the RBDMS 102.

Each parsing engine module 108, upon receiving an incoming database query, may apply an optimizer module 120 to assess the best plan for execution of the query. An example of an optimizer module 120 is shown in FIG. 1 with regard to a parsing engine module 108 of the processing node PN 2. Selecting the optimal query-execution plan may include, among other things, identifying which of the processing nodes 106 are involved in executing the query and which database tables are involved in the query, as well as choosing which data-manipulation techniques will serve best in satisfying the conditions of the query. To this end, for each parsing engine module 108, a parser module (not shown), and/or optimizer module 120 may access a data dictionary module 122, shown in FIG. 1 specifically for a parsing engine module 108 of processing node PN 2 for purposes of illustration.

The data dictionary module 122 may specify the organization, contents, and conventions of one or more databases, such as the names and descriptions of various tables maintained by the RBDMS 102, as well as fields of each database, for example. Further, the data dictionary module 122 may specify the type, length, and/or other various characteristics of the stored tables. The RBDMS 102 typically receives queries in a standard format, such as the structured query language (SQL) put forth by the American National Standards Institute (ANSI). However, other formats, such as contextual query language (CQL), data mining extensions (DMX), and multidimensional expressions (MDX), for example, may be implemented in the database system 100 separately or in conjunction with SQL. The data dictionary 122 may be stored in the DSFs 112, and cached in the memory 124 and/or the memory 113 included in the RBDMS 102.

The RBDMS 102 may also include a query log (QL) 126. The query log 126 may contain the time of events and list of objects accessed and modified by SQL DML commands, as well as the time of access of modification. In one example, the query log 126 information may be used to determine the frequency and manner that particular data tables stored in the RBDMS 102 are accessed through queries or other actions, such as data loading. The query log 126 may be stored in the DSFs 112.

The RBDMS 102 may include an active system management (ASM) module 128. The ASM module 128 may be implemented as a "closed-loop" system management (CLSM) architecture capable of satisfying a set of workload-specific goals. In other words, the RBDMS 102 is a goal-oriented workload management system capable of supporting complex workloads and capable of self-adjusting to various types of workloads. The ASM module 128 may communicate with each optimizer module 120 and is adapted to convey a confidence threshold parameter and associated parameters to the optimizer module 120 in communication. Further, the ASM module 128 may communicate with a dispatcher module 130 of each parsing engine module 108 to receive query execution plan costs therefrom, and to facilitate query exception monitoring and automated modifications of confidence threshold parameters in accordance with disclosed embodiments. Further, the DWM client 118 may communicate with the ASM module 128 via the network 116.

The ASM module 128 operation has four major phases: 1) assigning a set of incoming request characteristics to workload groups, assigning the workload groups to priority classes, and assigning goals (referred to as Service Level Goals or SLGs) to the workload groups; 2) monitoring the execution of the workload groups against their goals; 3) regulating (e.g., adjusting and managing) the workload flow and priorities to achieve the SLGs; and 4) correlating the results of the workload and taking action to improve performance. In accordance with disclosed embodiments, the ASM module 128 is adapted to facilitate control of the optimizer module 120 pursuit of robustness with regard to workloads or queries.

An interconnection 132 allows communication to occur within and between each processing node 106. For example, implementation of the interconnection 132 provides media within and between each processing node 106 allowing communication among the various processing units. Such communication among the processing units may include communication between parsing engine modules 108 associated with the same or different processing nodes 106, as well as communication between the parsing engine modules 108 and the processing modules 110 associated with the same or different processing nodes 106. Through the interconnection 132, the access modules 110 may also communicate with one another within the same associated processing node 106 or other processing nodes 106.

The interconnection 132 may be hardware, software, or some combination thereof. In instances of at least a partial-hardware implementation of the interconnection 132, the hardware may exist separately from any hardware (e.g, processors, memory, physical wires, etc.) included in the processing nodes 106 or may use hardware common to the processing nodes 106. In instances of at least a partial-software implementation of the interconnection 132, the software may be stored and executed on one or more of the memories 113 and processors 111 of the processor nodes 106 or may be stored and executed on separate memories and processors that are in communication with the processor nodes 106. In one example, interconnection 132 may include multi-channel media such that if one channel ceases to properly function, another channel may be used. Additionally or alternatively, more than one channel may also allow distributed communication to reduce the possibility of an undesired level of communication congestion among processing nodes 106.

As previously described, database information may be stored in the DSFs 112 as tables of data. In one example, the DSFs 112 of FIG. 1 may be virtual disks (vdisks). The term "virtual disks" may refer to specific groups of memory locations distributed across physical memory devices, such as flash drives, hard drives, or some combination thereof, for example. In one example, the parallel processing aspect of the RBDMS 102 may include a "shared nothing" functionality that allocates specific memory locations to each individual access module 110. The specific memory locations may exist in a single physical memory device or be distributed among various physical memory devices. In one example, the allocated memory locations may be exclusively associated with an individual access module 110 such that no access modules 110 are given access to memory locations allocated to other access module 110 during operation of the database system 100. Thus, for purposes of illustration in FIG. 1, each DSF 112 may include the memory locations allocated to the access modules 110 of the associated processing node 106.

In storing tables making up a database, the database system 100 may use row partitioning, such that each table is broken down into rows and stored across the DSFs 112. Row partitioning may be used in conjunction with the shared-nothing functionality such that each access module 110 is responsible for accessing only the rows of stored tables in the specifically-allocated memory locations. For example, each DSF 112 is shown in FIG. 1 as storing rows 115 for Table 1. Depending on the row partitioning for Table 1, rows 115 from Table 1 may be stored in memory locations allocated to each of the access modules 110.

During operation, data tables stored in the database system 100 are used at varying frequencies relative to one another. Some tables may be used so infrequently, that compressing them may be of some benefit to free up storage space within DSFs 112 for other uses. However, due to the time costs of compressing and decompressing data tables, various factors may be considered to ensure that each data table identified for compression is an efficient choice. In one example, a workload 134 may be received by the RBDMS 102 transmitted by the client computer system 114. The workload 134 may contain various queries and/or other actions, such as data loads, for example, generally identified as tasks $T_1$ through $T_N$, where N is the number of tasks. The workload 134 of FIG. 1 is merely representative of any number of workload configurations that may be received by the RBDMS 102. The term "workload" may refer to a single or multiple batch workloads, a series of sequential requests of the RBDMS 102, or some combination thereof, as well as any other suitable configuration recognizable by the RBDMS 102.

As each workload 134 is received by the RBDMS 102, the query log 126 may record each requested action of the workload 134. The information recorded in the query log 126 may be used to make determinations regarding compression and decompression of data tables. In one example, the RBDMS 102 may include a compression management module (CMM) 136. The CMM 136 may be configured to identify candidate tables for compression/decompression and provide instructions regarding the timing and manner of compression/decompression. In one example, the CMM 136 may analyze the query log 126 to determine the frequency with which various tables are being accessed and the times of access to determine the pattern of use of individual objects, such as tables, secondary indexes, join indexes, partitions of tables, etc. The CMM 136 may further analyze the pattern to identify opportunities to schedule decompression and compression of tables and/or entire databases based on the pattern of use. In one example, the CMM 136 may be stored in the memory 124 and executed by each of the parsing engine modules 108, as illustrated with a processing engine module 108 of the processing node PN 2 in the FIG. 1. Each parsing engine module 108 may access the CMM 136 stored in the DSFs 112 and cached in the memory 124 via the interconnect 132. In alternative examples, the CMM 136 may be stored on each of the processing nodes 106, such as in the respective memories 113. In such scenarios, each parsing engine module 108 may access and execute the CMM 136 from the local memory 113 of the corresponding processing node 106. In one example, execution of the CMM 136 by a particular parsing engine module 108 may preclude other parsing engine modules 108 from executing the CMM 136 until execution by the particular parsing engine module 108 is complete.

Based on the contents of the query log 126, the CMM 136 may determine that particular data tables are candidates for compression/decompression. In one example, the CMM 136 may identify candidate data tables to be compressed when not being used and provide instructions for compression of the data tables. Upon the need for the data stored in the compressed data table, such as by an application, for example, the CMM 136 may provide instructions for decompression of the data tables before needed for a particular event, such as a series of queries, and subsequent recompression, if desired, until frequently needed again. Various factors may be considered by the CMM 136 in determining if compression/decompression is desired. For example, if a data table is used continuously, it may be a poor candidate for compression/decompression due to processor usage of processing resources (e.g., access modules 110) of the database system 100 required for multiple compressions/decompressions. Other factors may be considered, such as the current usage level of the database system 100, the manner in which the data tables being considered is used, and availability of hardware resources typically available when the data table being considered is accessed, for example.

In one example, the CMM 136 may consider the time involved in decompressing and compressing a table. For example, a high priority application may require the use of particular table. The application may be executed by the database system 100 and have a strict service level goal (SLG) with a very short response time that is much less than the time involved in decompressing and possibly recompressing a previously compressed table used by the application. In such a scenario, the table may be a poor candidate for compression. In another example, the CMM 136 may consider the time difference of an application and any other applications using the table to a predetermined threshold. If the difference between the application runtime and the decompression/compression of the table is greater than the predetermined threshold, the CMM 136 may forgo compression of the particular table.

In scenarios involving multiple databases, the CMM 136 may also consider the frequency with which a data table is used during an active period of the corresponding database. In situations in which the database is used only a few times over a particular time window, decompressing sets of tables during a single time interval may be more efficient with respect to CPU usage than simply decompressing each table each time the table is needed. Decompressing the sets of tables eliminates the need for multiple decompression operations. In one example, the CMM 136 may compare the usage of the sets of tables to the candidate table based on the query log 126. If the ratio is greater than a predetermined threshold, the CMM 136 may generate compression/decompression instructions for the entire database as opposed to just the particular candidate table.

The CMM 136 may also consider a percentage of processor usage by the processing nodes 106 during a time period in which the table is used. In one example, the CMM 136 may determine that processing resources that use a particular table are typically bound at the time of usage. However, the CMM 136 may recognize that the processing resources are not bound in the time leading up to the period of use of the particular data table and/or the time after the usage. In such a scenario, the CMM 136 may determine that the data table is a candidate for compression/decompression and schedule decompression prior the processing resources bound during the usage period of the data table and schedule compression after the processing resources are no longer bound.

The CMM 136 may also consider the amount of free memory space of available memory devices during the period of time a candidate data table is typically used. If there is inadequate available space during this period to decompress the entire candidate table, the CMM 136 may determine to forgo compression/decompression of the candidate table. In other examples, the CMM 136 may determine that the data table may be decompressed in data blocks, if the data table has been compressed using block level compression (BLC), for example. In such a scenario, the CMM 136 may schedule the decompression of the data blocks of the data table as needed. The CMM 136 may also determine that the data table may be decompressed in data partitions if compressed in such a manner.

The CMM 136 may implement one or more of these considerations in determining the compression/decompression status of a data table. Applicability of the considerations may depend on the particular circumstances of use of a data table, such as for a particular application. In various examples, the CMM 136 may take one or more of the considerations into account when determining the candidacy of a table for compression/decompression.

The CMM 136 may inspect the query log 126 at predetermined times or during a period of reduced activity in the database system 100. This period of reduced activity may be based on a particular usage percentage threshold associated with processing availability of the database system 100.

In one example, these considerations may be used as candidate criteria to determine if a table is viable candidate for compression/decompression. In such an example, upon designation of a table as a candidate for compression/decompression, the CMM 136 may determine if compression/decompression of data, such as that in a data table, will be performed based on the relationship of:

$$\text{CPU\_cost/Space\_save} < \text{Threshold} \qquad \text{Eqn. 1}$$

where "Threshold" is a predetermined value that reflects a tradeoff on storage space and speed of response for a particular database system. In other words, the "Threshold" value represents how much CPU time a user can tolerate being used in order to save a unit of storage space. The "compression cost", which is the "CPU_cost/Space_save" value, being less than the "Threshold" value may provide an indicator that compression is worthwhile. The "Threshold" value may be configured for each platform based on platform characteristics for certain database system usages. "Space_save" may represent the total storage space that can be saved via compression. In one example, "Space_save" may be expressed as:

$$\text{Space\_save} = \text{Data\_size} * \text{Comp\_rate} \qquad \text{Eqn. 2}$$

where "Comp_rate" may refer to the compression rate for a particular compression algorithm. In one example, such compression rates may be obtained from looking up a system table that automatically records compression rates for each available compression algorithm on tables at a data block level, data partition level, and at a column level that have been attempted, or attempting on a sample of the data if not available yet. In Eqn. 2, "Data_size" may refer to the amount of data targeted for compression/decompression.

The term "CPU_cost" may refer to the total compression CPU cost for compressing data on a write operation and decompressing the data on a read operation, where the temperature of the data may be taken into account. For example, the "CPU_cost" may be expressed as:

$$\text{CPU\_Cost} = \text{Cost\_modify} + \text{Cost\_read} \qquad \text{Eqn. 3}$$

where $$\text{Cost\_modify} = \text{Temp\_modify} * (\text{Cost\_comp} + \text{Cost\_decomp}) \qquad \text{Eqn. 4}$$

$$\text{Cost\_read} = \text{Temp\_read} * \text{Cost\_decomp} \qquad \text{Eqn. 5}$$

where "Temp_modify" and "Temp_read" may refer to the data temperature. In one example, each unit of compression (e.g., data block, data partition, data table row, and data table column) may have an associated "temperature" associated with a read or write performed one each. The "temperature" of the data may indicate how frequently it is accessed against a given time window. The more frequently the data is accessed, the "hotter" the data. Data temperature may refer to the access frequency of data, e.g., the number of read or write operations over a particular time window (day, week, or month).

In one example, data temperature may be obtained directly from a subsystem of the database system like the Teradata Virtual Storage® system. In one example, data temperature may be determined directly from the object use count information stored in data dictionary 122 in the database system. Data temperature may also be calculated or predicted based on the query log 126. Data temperature may be maintained at different levels, such as at the table level, at the partition level, at the data block level, at the column level. In one example, a specific partition holding the current month transaction data may be hot, but other partitions holding past transaction data may be cold. In one example, one column is cold across the whole table, but another column is hot in some partitions, warm in some other partitions and cold in the rest of the partitions. Data temperature ranges may be given a corresponding measurement value to indicate temperature, such as 0 for "cold," 1 for "cool," 2 for "warm," and 3 for "hot," for example.

The "Cost_modify" term includes both the compression cost and decompression due to updates typically requiring decompression of existing data and new data to be compressed. In the case of data insertion, especially batch inserts, involved data blocks' Temp_modify is typically cold with a value of 0, and thus, Eqn. 4 will still apply. The terms "Cost_comp" and "Cost_decomp" may refer to the processing resource cost of compressing data and decompressing data, respectively. In this sample evaluation, the cost does not include any potential savings from a likely decrease in inputs/outputs (I/Os) and additional cache hits. But in more sophisticated evaluations, potential savings may increase from potential I/O decrease and additional cache hits. The processing resource cost of each may include two parts measurable in units of time or number of machine instructions: (1) the compression/decompression function invocation cost; and (2) per byte processing cost. In one example, these costs for each available compression/decompression algorithms may be provided at the time of including an algorithm to the system. In other examples, these costs may be measured by the database system using sample data.

In operation, upon review of the query log 126, the CMM 136 may evaluate various data tables for possible compression/decompression. This evaluation may occur on a table-by-table basis at predetermined times or may occur based on events, such as those logged in the query log 136. Upon a determination that a data table should be compressed or decompressed, the CMM 136 may issue compression instructions (CI) 138. The compression instructions 138 may provide instructions indicating which data tables are designated for compression or decompression and the compression strategy to be used. In the case of compression and decompression, the parsing engine module 108 executing the CMM 136 may communicate the compression instructions 128 to access modules 110 that correspond to rows of the data table designated for compression or decompression, which allow the access modules 110 to perform accordingly in retrieving the rows and performing the compression or decompression.

Figure 2:
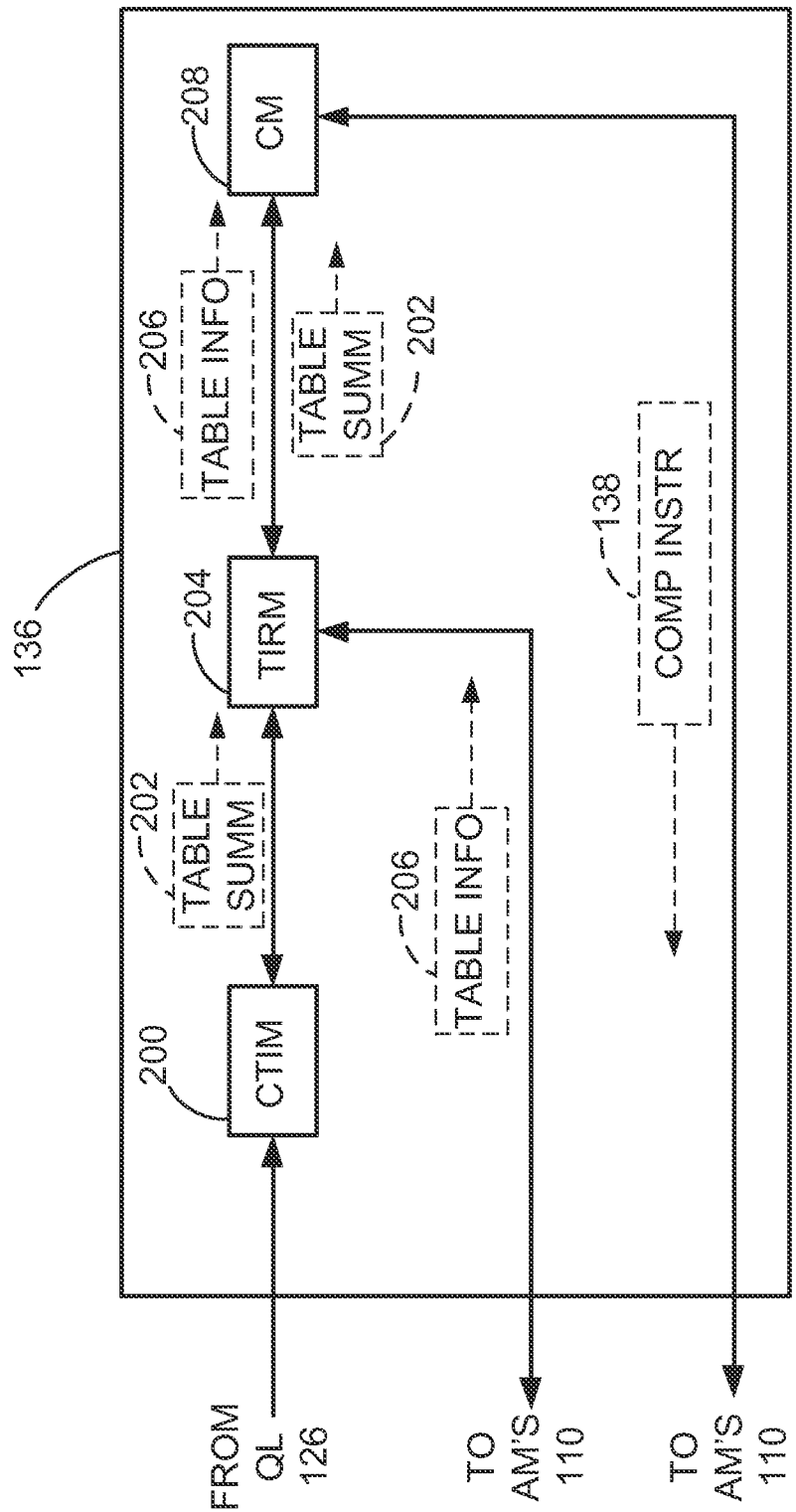
FIG. 2 is a block diagram of an example of a compression management module.

FIG. 2 is a block diagram of one example of the CMM 136. In one example, the CMM 136 may include various sub-modules, such as the candidate table identification module (CTIM) 200. The CTIM 200 may retrieve the contents of the query log 126 and determine, based on the contents of the query log 126, which tables are candidates for compression/decompression. The CTIM 200 may make such determination based on the various considerations discussed, such as particular applications using the tables, table use timing, and available database processing/memory resources. Upon a determination that a data table is a candidate for compression/decompression, the CMM 136 may implement a table information retrieval module (TIRM) 204. In one example, the CTIM 200 may provide a table summary message 202 to the TIRM 204 that indicates the particular table being considered for compression/decompression, as well as the associated query log contents used by the CMM 136 to designate the table as a candidate for compression/decompression. Upon receipt of the table summary message 202, the TIRM 204 may communicate with the processing node 106 to retrieve information about a data table being considered for compression/decompression. In one example, the TIRM 204 may communicate with one or more parsing engine modules 108, which may communicate with the access modules 110 associated with rows of the data table being considered for compression/decompression. The access modules 110 may gather information related to the data table being considered for compression/decompression. The gathered information may be returned to the TIRM 204 in a table information message 206, which may include one or more messages providing the desired information to the TIRM 204.

The TIRM 204 may provide the table summary message 202 and the table information message 206 to a compression module (CM) 208. The compression module 208 may determine, based on the table summary message 202 and table information message 206, if compression/decompression is appropriate. In one example, the CM 208 may schedule the compression/decompression of the data tables and generate the compression instructions 138 and transmit them to the appropriate processing nodes 106 at the appropriate times. For example, the CTIM 200 may determine that a particular table is a candidate for compression/decompression for use during a period of use by a particular application. In such a scenario, the TIRM 204 may obtain the table summary message 202 and the table information message 206 and provide it to the CM 208. The CM 208 may generate and provide the compression instructions 138 to the access modules 110 in order to perform the compression. The CM 208 may also maintain a compression/decompression schedule for the data table based on the table summary message 202. Through use of the schedule, the CM 208 may provide additional compression instructions to the access modules 110 at appropriate times, such as when the data table requires decompression in order to be appropriately used by an application and recompression after the use is complete. In one example, the schedule maintained by the CM 208 may be condition-based such that the CM 208 provides decompression instructions 138 during a period of reduced activity in the RBDMS 102. Similarly, the CM 208 may provide compression instructions 138 to the access modules 110 to recompress the table during an appropriate time, such as during a period of reduced activity in the RBDMS 102, subsequent to the application completing use of the data table.

Figure 3:
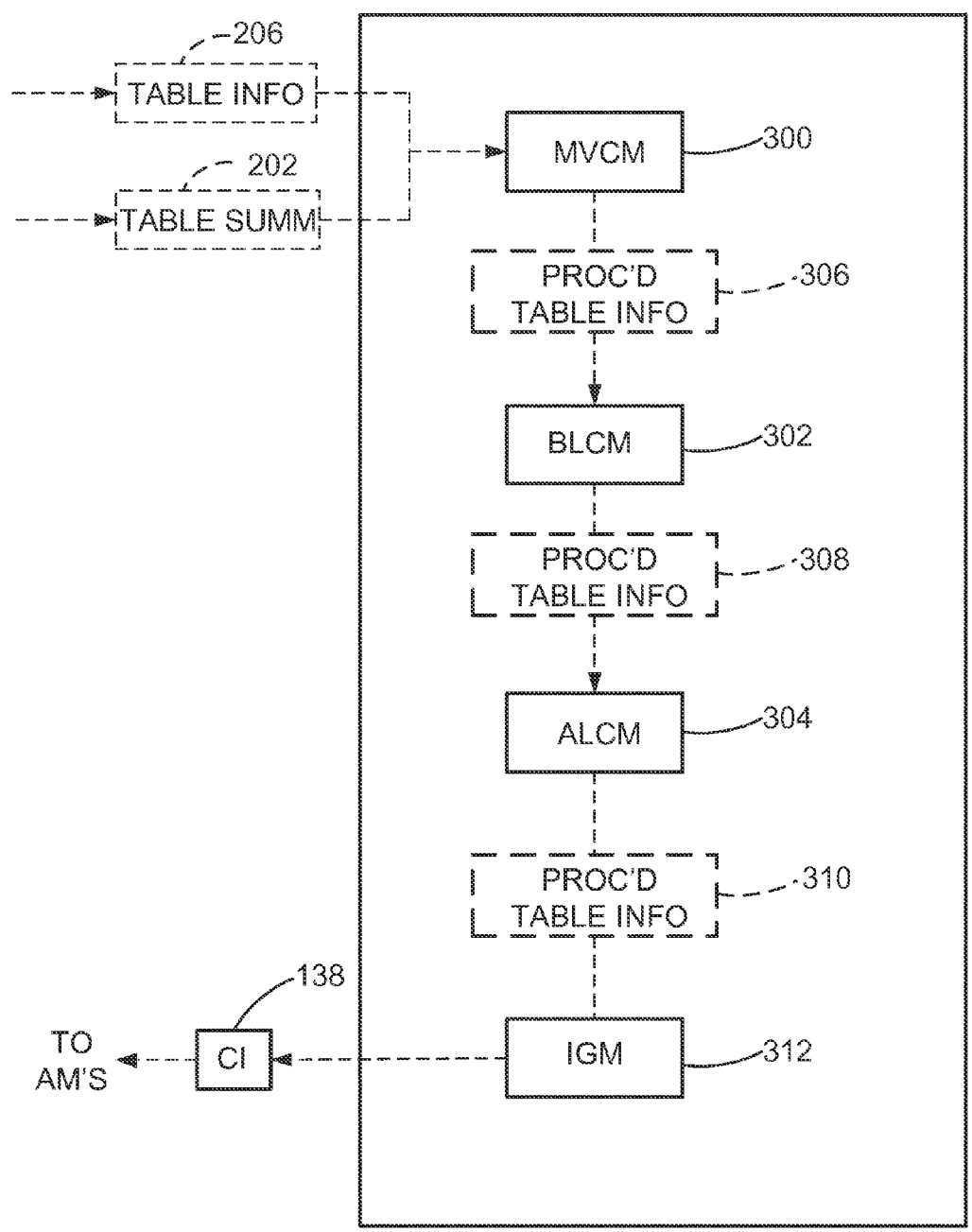
FIG. 3 is a block diagram of an example compression module.

FIG. 3 is a block diagram of an example of the CM 208. In one example, the CM 208 may include various sub-modules that provide various data compression strategies. The CM 208 may implement a multi-value compression module (MVCM) 300. In one example, the MVCM 300 may be based on multi-value compression (MVC), such as that described in "Teradata Database Administration," Release 13.10, B035-1093-109A, November 2010 (hereinafter "Teradata Database Administration"), which is incorporated by reference herein in its entirety. In one example, multi-value compression may be associated with performing compression of specific values at the column-level of a data table. In one example, MVC may be implemented such that common values that may appear in particular columns of a table are identified. If a column value is identified for compression via MVC, upon insertion of the column value into the data table, such as through row insertion, the value will not be stored. Instead, compression bits for this column will be set accordingly to indicate which value it is in the value list. In one example, the value list may be kept in the table header of the data table in a value dictionary. The value list can be kept in a table shared by columns of tables within the database, even multiple databases. Data type and other attributes for each column may also be included in the table header. An attribute at the column level or at the table level may be used to indicate the next recommended date of searching for MVC opportunities. A default date of the current date may be used in some examples.

In some examples the next recommended search date may be determined based on the update frequency, i.e., Temp_modify, of the column under consideration for MVC. In one example, the next search date may be found using the following:

$$\text{Next\_search\_date} = \text{Current\_date} + \text{Wait\_days}/(c1*\text{Temp\_modify} + c2) \qquad \text{Eqn. 6}$$

where "Wait_days" is a value representing the number of days (or some alternative time period) to wait for searching MVC opportunities of cold data next time compression is considered. The values "c1" and "c2" are predetermined constants based on the chosen data temperature value range that makes the expression "$c1*\text{Cold\_temp}+c2$" equal to 1, where "Cold_temp" is the predetermined cold temperature value. For example, cold_temp may be 0 and c1 and c2 may both be 1. Wait_days may be may be predetermined based on the system resource situation. For systems with excessive CPU cycles but short on space, Wait_days for cold data may be specified with a lower value, for example "7" for searching weekly; for systems that are CPU bound, it may be specified with a higher value, such as 30 for searching monthly.

The CM 208 may also apply BLC through a block level compression module (BLCM) 302. In one example, BLC may be used to compress data tables at a data block level. BLC may include features such as those described in Teradata Database Administration, which has previously been incorporated by reference. In using BLC, when a query needs to access even a single column of a single row of a data table compressed under BLC, the entire data block is decompressed in order to obtain the column value. In one example, BLC may be implemented at the individual data block level of data tables enabling the BLCM 302 to compress and decompress individual data blocks of a data table. Multiple algorithms may be available to the BLCM 302 to apply BLC.

The CM 210 may also apply algorithmic compression (ALC) through an algorithmic compression module (ALCM) 304. In one example, ALC may be used to compress data tables at the column level based on user-defined compression and decompression algorithms or other pre-defined algorithms. ALC may include features such as those described in Teradata Database Administration, which has been previously been incorporated by reference. ALC and MVC may be used together with ALC applied to column values not specified in MVC lists. In one example, ALC may be applicable to individual rows in specific data blocks of a data table for specific columns. In one example, row headers included in a table may include "compress bits" indicating whether or not a column in the row is compressed. Multiple algorithms may be available to the ALCM 304 to apply ALC.

During operation, the MVCM 300 may receive the table summary message 202 and the table information message 206 for a candidate table. In one example, regardless of the temperature of the data in the candidate table data, the MVCM 300 may look for MVC compression/decompression opportunities within the candidate data table. In one example, the MVCM 300 may inspect the table header to compare the current date to the recommended next search date. If the current date is on or after the recommended next search date, the MVCM 300 may determine any column not having MVC yet applied contain many recurring values and it is worthwhile to apply MVC on the column. The MVCM 300 may determine that any column that has MVC applied already but the column contains new recurring values, so the MVC value list needs to be updated. Also, the MVCM 300 may determine that MVC applied to some columns is to be removed in case the data has changed so much that there are no longer significant recurrences of values in the column.

Upon completion of any MVC by the MVCM 300, the MVCM 300 may provide the processed table information 306 to the BLCM 302, which may also include the table summary information in the table summary message 202. The processed table information 302 may include any changes to be made to the table data made via MVC. The BLCM 302 may determine if any data blocks of the candidate data table are to be compressed or decompressed. In one example, the BLCM 302 may determine compression or decompression of a candidate table based on Eqn. 1. If the candidate table does not have BLC currently applied, the BLCM 302 may implement Eqn. 1 as applied to each data block of the candidate table for each available BLC algorithm and select the one having the lowest compression cost. Thus, the BLCM 302 may determine, for each data block of the candidate table based on the table information 306, if compression or decompression should occur.

In using Eqn. 1, the BLCM 302 may determine if the compression cost is less than a predetermined threshold. If the compression cost is greater than the threshold, compression may be performed by the BLCM 302 of the particular data block under consideration from the candidate table. If the block is currently under compression, the BLCM 302 may evaluate Eqn. 1 for each available BLC algorithm. If the compression cost is greater than or equal to the predetermined threshold for all available BLC algorithms, the BLCM 302 may then determine that the data block being evaluated is to be decompressed. If the compression cost is less than the predetermined threshold, the BLCM 302 the compression of the data block may be maintained and updated to apply the BLC algorithm having the lowest compression cost. If no BLCM 302 is performed, after each data block of the candidate data table is analyzed by the BLCM 302, the processed table information 306 may be transmitted to the ALCM 304, which includes the table summary information. The processed table information may also indicate if BLC is to be applied. In examples in which BLC is used, no ALC may be applied by the ALCM 304 due to compression already taking place for the particular rows included in the compressed data block.

If no BLC has been applied, upon receipt of the processed table information 306, the ALCM 304 may determine if ALC opportunities exist for the candidate data table. The ALCM 304 may determine if the ALC compression should be applied to the candidate data table on one or more columns through an evaluation of Eqn. 1. All available ALC compression algorithms will be evaluated separately for each candidate column. If the compression cost for multiple algorithms is less than the predetermined threshold, then the ALCM 304 may determine the ALC algorithm associated with the lowest compression cost is to be applied to the candidate column. If the compression cost is greater than or equal to the predetermined threshold, no ALC is performed. If the candidate column includes ALC already, evaluation of Eqn. 1 allows the ALCM 304 to determine if the current compression is to be maintained with the current ALC algorithm, updated with a different ALC algorithm, or removed. ALC-based instructions may be included in the processed table information 310.

The processed information 310 may be transmitted to an instruction generation module (IGM) 312. The IGM 312 may generate the compression instructions 138 based on the contents of the processed table information 310. The compression instruction 138 may be transmitted to the access modules 110 associated with rows of the table designated for compression/decompression.

In one example, the IGM 312 may maintain the schedule for compression and decompression of various tables. In such scenarios, the IGM 312 may provide the compression instructions at the appropriate times to the access modules 110 to perform compression or decompression of a table. In other examples, the IGM 312 may send the instructions in batches.

Figure 4:
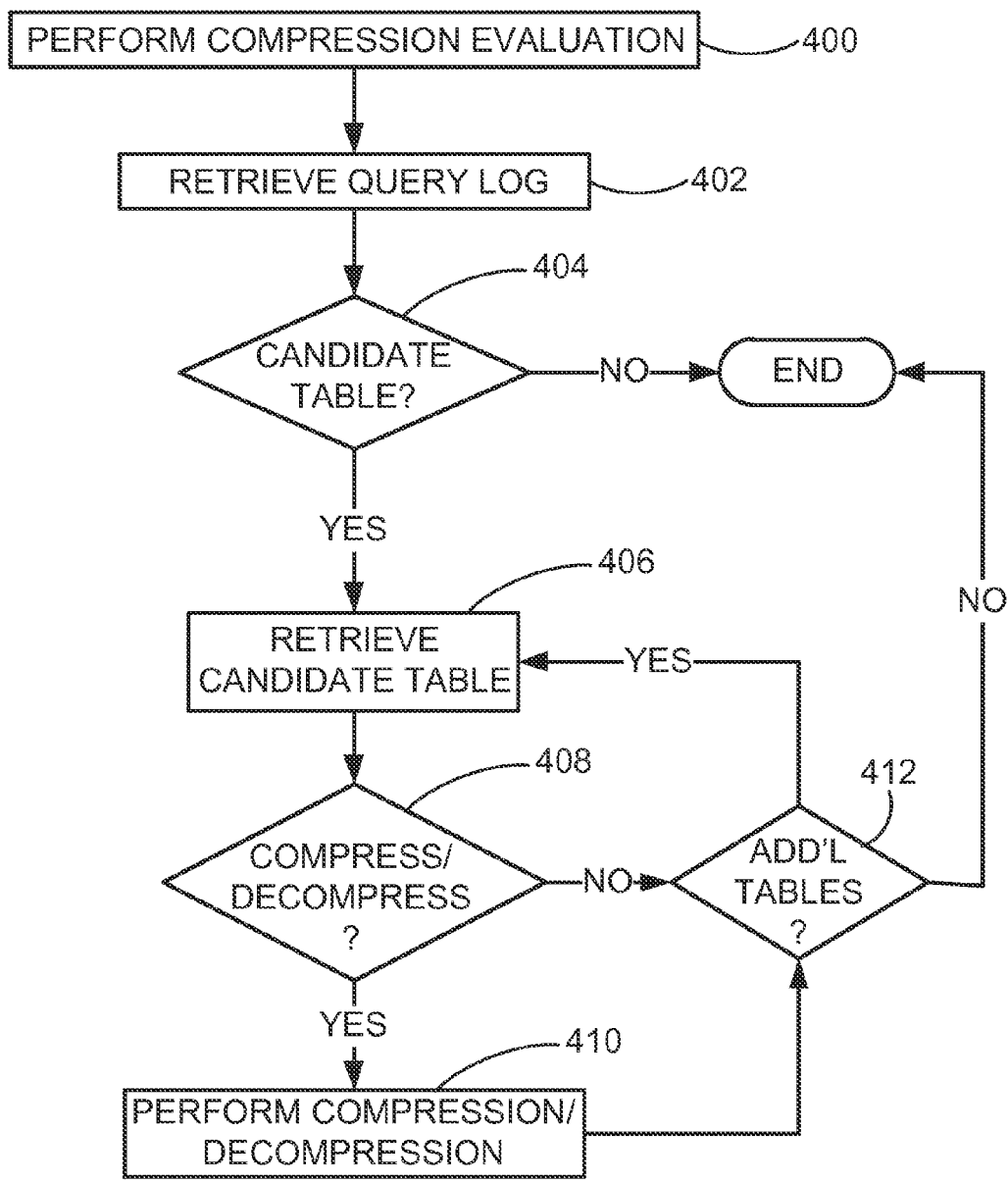
FIG. 4 is an operation flow diagram of an example operation of the compression management module of FIG. 2.

FIG. 4 is an operational flow diagram of an example operation of the database system 100 during performance by the CMM 136. The database system 100 may determine to perform compression evaluation (400). The compression evaluation may be triggered by various predetermined conditions, such as an elapsed predetermined amount of time or the database system usage falling below a predetermined usage threshold. The CMM 136 may retrieve the query log 126 (402). The CMM 136 may evaluate the query log 126 to determine if candidate tables exist for evaluation of compression/decompression (404). Various factors may be considered either separately or in combination to determine that a candidate table exists as discussed with regard to FIGS. 1 and 2. For example, such factors may include the particular application(s) using the table, timing use, and available resources of the database system 100. If no data tables meet candidate criteria, the compression evaluation may end. If, based on the contents of the query log 126, at least one table is a candidate for compression/decompression, the CMM 136 may then retrieve the candidate data table through use of the access modules 110 (406). Upon retrieval of the candidate data table, the CMM 136 may determine if compression or decompression is appropriate (408). If compression/decompression is appropriate, the compression/decompression may be performed by the CMM 136 (410). Upon completion of the compression/decompression or if the CMM 136 determines no compression/decompression is to be performed, the CMM 136 may determine if additional candidate tables exist based on information in the query log 126 (412). If additional candidate tables exist, each additional candidate table may be evaluated for compression/decompression until each additional candidate table has been evaluated.

Figure 5A:
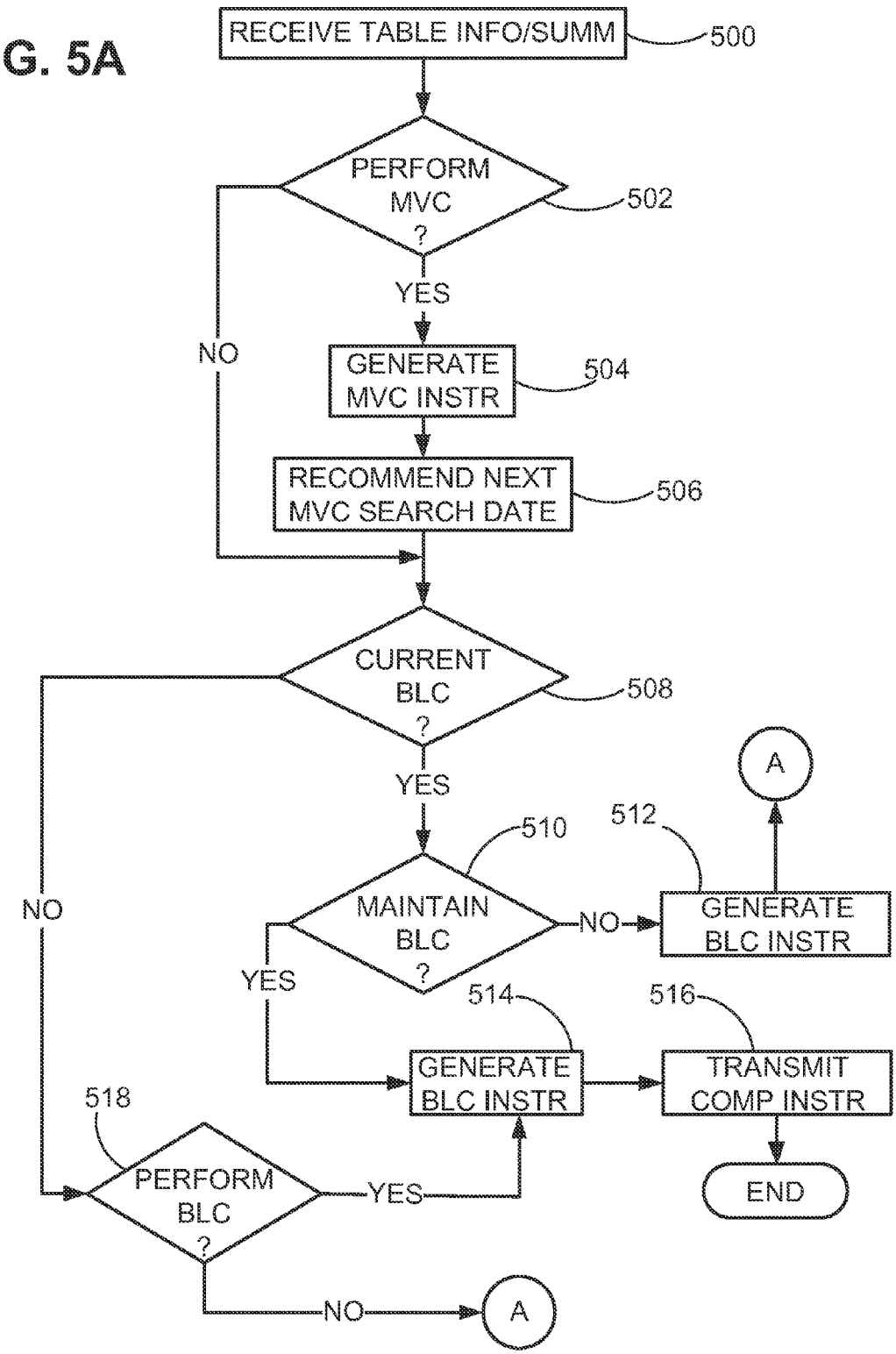
FIGS. 5A and 5B are an operational flow diagram of an example operation of the compression module of FIG. 3.
Figure 5B:
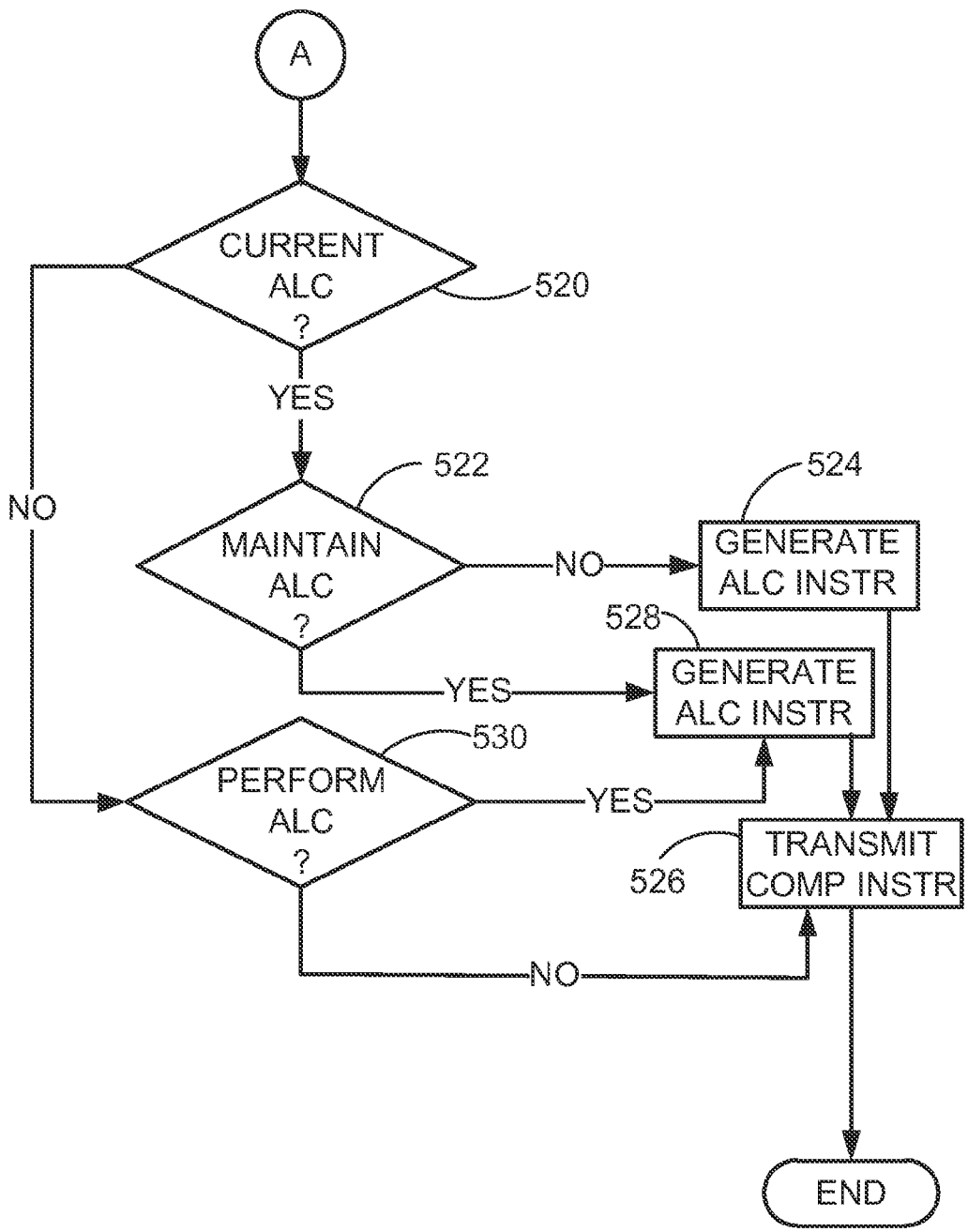

FIGS. 5A and 5B are an operational flow diagram for an example operation of the CM 208. In one example, the CM 208 may receive the table information message 206 from the TIRM 204 for a data table identified as a candidate for compression/decompression (500). The CM 208 may then determine if MVC of the data table should be performed (502). In one example, performance of MVC may be applied to on various columns of the table. Such indication may be present in the table header of the table under consideration for compression. If MVC is to be performed, the CM 208 may generate compression instructions 138 to include MVC (504). Upon performance of MVC, the CM 208 may recommend a future search date for the MVC of the data table (506). Any such scheduling of a future search date may be maintained in the IGM 312 or may be maintained in a different location within the RBDMS 102.

After the recommended search date has been established or if no MVC is to be performed for the candidate data table, the CM 208 may determine if BLC is currently being applied to the candidate table (508). If BLC is being currently applied to the candidate table, the CM 208 may determine if the BLC algorithm currently applied should be maintained, apply a different BLC algorithm, or remove BLC (510). In one example, the BLCM 302 may evaluate Eqn. 1 for each available BLC algorithm using the information included in the table summary message 202 and the table information message 206. If evaluation of Eqn. 1 for each available BLC algorithm indicates that the compression cost is greater than or equal to the predetermined "Threshold" value, the current application of BLC may no longer be worthwhile. If the BLC is to be removed, the CM 208 may generate decompression instructions 138 to decompress the data blocks of the data table to be decompressed (512).

In evaluating Eqn. 1 for each available BLC algorithms, the BLC algorithm that achieves the lowest compression cost will be chosen to update BLC. If BLC is to be updated and is to be maintained, the CM 208 may generate compression instructions 138 indicating such (514) and may include any instructions generated regarding MVC. The compression instructions 138 may then be transmitted by the CM 208 to the access modules 110 to perform any compression/decompression included in the compression instructions (516).

If no BLC is currently applied, the CM 208 may determine if BLC is to be applied (518). In one example, this determination may be based on the results of Eqn. 1 for each available BLC algorithm with the BLC algorithm achieving the lowest compression cost being chosen to update BLC. If BLC is to be applied, the CM 208 may generate the compression instructions 138 to include BLC instructions (514), which may be appended to any previously generated instructions regarding MVC as well. The compression instructions may then be transmitted to the access module 110 to carry out the instructions (516).

If no BLC is applied to the table, the CM 208 may determine if the candidate data table is currently under ALC (520). If the candidate data table is currently under ALC, the CM 208 may determine if ALC is to be maintained (522). In one example, the CM 208 may evaluate Eqn. 1 for each available ALC algorithm. If the compression cost is greater than or equal to the "Threshold" value for each of the available ALC algorithms decompression instructions 138 to remove ALC may be generated (524) and transmitted along with any other preexisting instructions (526), such as those associated with MVC.

If the evaluation of Eqn. 1 for each available ALC algorithm indicates that the compression cost for more than one available ALC algorithm is less than predetermined "Threshold" value, the ALC algorithm having the lowest compression cost may be used. Upon selection of an ALC algorithm, instructions 138 indicating such may be generated (528) and transmitted (526) along with any preexisting instructions to the access modules 110 to be carried out. Operation of the CM 208 may then be discontinued until the next candidate data table is identified by the CMM 136.

If no ALC is currently applied, the CM 208 may determine if ALC is to be performed on the candidate data table (530). In one example, the CM 208 may evaluate Eqn. 1 for each available ALC algorithm. The CM 208 may select the available algorithm having the lowest compression cost that is less than the predetermined "Threshold" value. If ALC is to be performed, the CM 208 may generate compression instructions 138 indicating such (528). The compression instructions 138 may also include any instructions regarding MVC or any other preexisting instructions. The compression instructions 138 may be transmitted to the access modules 110 to perform any compression/decompression (526). If no ALC is to be performed, instructions regarding such may be transmitted along with any MVC instructions (536). After ALC related activities are completed, operation of the CM 208 may be discontinued until another candidate table is identified.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A database system comprising:
   at least one storage device configured to store a database and a query log, wherein the database comprises data organized into a plurality of database tables, and wherein the query log is a data object comprising information associated with usage of at least a subset of the database tables in database related tasks, wherein the information includes respective specific usage times for each of the plurality of database tables in database-related tasks;
   a processor in communication with the at least one storage device; and
   a compression management module executable by the processor to:
   retrieve the query log;
   determine the respective specific usage times of the plurality of database tables from the query log;
   determine the presence of at least one condition associated with the database system;
   select a database table from the plurality of database tables for data compression based on the presence of the at least one condition associated with the database system and the respective specific usage times of the database table based on the information in the query log; and
   generate a schedule to compress and decompress at least a portion of the database table.

2. The database system of claim 1, wherein the compression selection module is further executable to generate instructions to compress at least a portion of the database table.

3. The database system of claim 1, wherein the query log is configured to log database query information that includes an index in the database system.

4. The database system of claim 1, wherein the compression management module is further executable to retrieve information associated with the database table from the database based on the query log.

5. The database system of claim 1, wherein the compression management module is further executable to:
   determine a frequency of usage of the database table over a period of time based on the query log,
   wherein the schedule to compress and decompress the at least a portion of the database table is based on the frequency of usage of the database table over the period of time.

6. The database system of claim 1, wherein the compression management module is further executable to:
   determine a change in access frequency of the database table over a predetermined period of time, wherein the access frequency is representative of a number of times the database table is accessed over the predetermined period of time; and
   select the database table for data compression in response to the access frequency being less than a predetermined frequency threshold.

7. The database system of claim 1, wherein the compression management module is further executable by the processor to determine that a percentage of use of processing resources of the database system is greater than a predetermined percentage during a period of time, wherein at least one of the respective specific usage times of the database table falls within the period of time,
   wherein the schedule includes that decompression of the at least a portion of the database table is to occur at a time prior to the period of time.

8. The database system of claim 7, wherein the compression management module is further executable by the processor to recompress the at least a portion of the database table subsequent to the expiration of the period of time.

9. The database system of claim 7, wherein the compression management module is further executable by the processor to:
   determine an amount of storage space available to the database system;
   determine that the amount of available storage space is lower than a predetermined threshold; and
   generate instructions to compress the at least a portion of the database table in response to the amount of available storage space being lower than the predetermined threshold.

10. A method of data compression in a database system, the method comprising:
    retrieving, with a processor, a data object from a storage device, wherein content of the data object comprises information associated with usage of at least a subset of the database tables in database related tasks, wherein the information includes respective specific usage times for each of a plurality of database tables in a database in response to a database task, wherein each database table comprises organized data records of the database;
    determine the respective specific usage times of the plurality of database tables from the data object;
    determine the presence of at least one condition associated with the database system;
    selecting, with the processor, a database table from the plurality of database tables for data compression based on the presence of the at least one condition associated with the database system and the respective specific usage times of the database table as indicated in the information in the data object; and
    generating, with the processor, a schedule to compress and decompress at least a portion of the database table.

11. The method of claim 10, further comprising compressing, with the processor, at least a portion of the database table stored in a predetermined-sized portion of data storage space or a row of the database table.

12. The method of claim 11, wherein compressing, with the processor, at least a portion of the database table stored in a predetermined-sized portion of data storage space or a row of the database table comprises:
    selecting, with the processor, at least one data partition containing the at least a portion of the database table for compression;
    determining, with the processor, a compression cost represented by:
    CPU_cost/Space_save
    wherein CPU_cost is a value indicative of an amount of processing resources used for a combination of at least one compression operation and one decompression operation for the at least one data partition and Space_save is a value indicative of a difference between an amount of storage space occupied by an uncompressed version of at least one data partition and a compressed version of the at least one data partition; and compressing, with the processor, the at least one data partition in response to the compression cost being less than a predetermined threshold value.

13. The method of claim 11, wherein compressing, with the processor, at least a portion of the database table stored in a predetermined-sized portion of data storage space or a row of the database table comprises:

selecting, with the processor, at least one data block containing the at least a portion of the database table for compression;

determining, with the processor, a compression cost represented by:

CPU_cost/Space_save wherein CPU_cost is a value indicative of an amount of processing resources used for a combination of at least one compression operation and one decompression operation for the at least one data block and Space_save is a value indicative of a difference between an amount of storage space occupied by an uncompressed version of at least one data block and a compressed version of the at least one data block; and compressing the at least one data block in response to the compression cost is less than a predetermined threshold value.

14. The method of claim 11, compressing at least a portion of the database table stored in a predetermined-sized portion of data storage space or a row of the database table comprises:

selecting, with the processor, the row of the database table for compression;

determining, with the processor, a compression cost represented by:

CPU_cost/Space_save wherein CPU_cost is a value indicative of an amount of processing resources used for a combination of at least one compression operation and one decompression operation for the row of the database table and Space_save is a value indicative of a difference between an amount of storage space occupied by an uncompressed version of the row of the database table and a compressed version of the row of the database table; and compressing, with the processor, the at least one row in response to the compression cost being less than a predetermined threshold value.

15. A non-transitory computer-readable medium encoded with computer-executable instructions, the computer-executable instructions executable with a processor, the computer-readable medium comprising:

instructions to retrieve, from a data object, database-table-usage patterns for a plurality of database tables of a database, wherein the database table-usage patterns include respective specific usage times for each database table in a database-related task;

instructions to identify at least one database table from a plurality of database tables of a database as a candidate for data compression based on at least one respective specific usage time of the database table, wherein each database table comprises a data object of organized data records in the database;

instructions to determine presence of at least one condition associated with the database table; and instructions to generate a schedule to compress and decompress at least a portion of the database table in response to the determination of the presence of the at least one condition associated with the database table.

16. The non-transitory computer-readable medium of claim 15, wherein the instructions to determine presence of at least one condition comprise instructions to determine presence of a plurality of conditions associated with the database table, wherein each of the plurality of conditions is associated with a respective one of a plurality of compression strategies, and wherein the instructions generate a schedule comprise:

instructions to select a first one of the plurality of compression strategies based on the determination of the presence of a respective one of the plurality of conditions; and instructions to generate the schedule to compress the at least a portion of the database table according to the selected first one of the plurality of compression strategies.

17. The non-transitory computer-readable medium of claim 16, wherein the instructions to select a first one of the plurality of compression strategies comprise instructions to select a compression strategy configured to compress at least one column value of a column of the database table.

18. The non-transitory computer-readable medium of claim 16, wherein the instructions to compress further comprise instructions to select a second one of the plurality of compression strategies based on the determination of a respective one of the plurality of conditions, wherein the instructions to generate the schedule comprise instructions to generate the schedule to compress the at least a portion of the database table according to the selected second one of the plurality of compression strategies.

19. The non-transitory computer-readable medium of claim 18, wherein the instructions to select a first one of the plurality of compression strategies comprise instructions to select a compression algorithm configured to compress at least one portion of data storage of a predetermined size, wherein the at least one portion of data storage stores a portion of the database table.

20. The non-transitory computer-readable medium of claim 18, wherein the instructions to compress further comprise:

instructions to determine absence of the respective one of the plurality of conditions associated with the second one of the plurality of compression strategies; and instructions to select a third one of the plurality of compression strategies based on a determination of presence of a respective one of the plurality of conditions, wherein the instructions to generate the schedule comprise instructions to generate the schedule to compress the at least a portion of the database table according to the selected third one of the plurality of compression strategies.

21. The non-transitory computer-readable medium of claim 15, wherein the instructions to retrieve, from a data object, database-table-usage patterns for a plurality of database tables of a database, wherein the database table-usage patterns include respective specific usage times for each database table in a database-related task comprise:

instructions to retrieve a query log; and instructions to determine the database-table-usage patterns from the query log.

22. A method of data compression in a database system, the method comprising:

selecting, with a processor, a database table from a plurality of database tables of a database for compression, wherein each database table comprises a data object of organized data records in the database;

determining, with the processor, in a predetermined order, that a respective condition associated with one of a plurality of compression routines is present in the database table; and in the predetermined order, for each compression routine having the presence of the associated condition, compressing, with the processor, the database table according to the compression routine in response to presence of the respective condition.

23. The method of claim 22, wherein the plurality of compression routines comprise a first, second, and third compression routine, wherein the method further comprises forgoing, with the processor, determination of a condition respective to the third compression routine in response to determination of presence of a condition in the database table respective to the second compression routine.

24. The method of claim 23, further comprising:

determining, with the processor, if the database table is compressed according to the second compression routine;

determining, with the second database table, if the respective condition of the second compression routine is present in the database table; and decompressing, with the processor, the database table from the second compression routine in response to absence of the respective condition of the second compression routine.

25. The method of claim 24, further comprising:

in response to the absence of the respective condition of the second compression routine, determining, with the processor, presence of the respective condition of the third compression routine; and compressing, with the processor, the database table according to the third compression routine in response to absence of the respective condition of the second compression routine and presence of the respective condition of the third compression routine.

26. The method of claim 23, wherein the first compression routine is a multi-value compression routine, the second compression routine is a block level compression routine, and the third compression routine is an algorithmic compression routine.

* * * * *